United States Patent [19]

Kaneki

[11] 4,363,846
[45] Dec. 14, 1982

[54] PHOTOMASK AND PHOTOMASK BLANK

[75] Inventor: Satoru Kaneki, Sayama, Japan

[73] Assignee: Dai Nippon Insatsu Kabushiki Kaisha, Tokyo, Japan

[21] Appl. No.: 317,343

[22] Filed: Nov. 2, 1981

[30] Foreign Application Priority Data

Dec. 22, 1980 [JP] Japan .................. 55/180409

[51] Int. Cl.³ .................. B32B 3/00; B32B 7/00; G03F 7/00
[52] U.S. Cl. .................. 428/203; 118/504; 118/505; 156/656; 156/667; 427/164; 427/165; 427/166; 428/209; 428/210; 428/333; 428/432; 428/472; 428/698; 428/702; 430/5; 427/255.3
[58] Field of Search .............. 118/504, 505; 156/655, 156/656, 659.1, 664, 667; 427/162, 164–166, 248 C, 255, 259, 264, 269–272, 282, 287; 428/195, 201, 203, 204, 209, 210, 212, 213, 215, 216, 323, 328, 332, 333, 426, 432, 433, 469, 472, 688, 698, 702; 430/4, 5

[56] References Cited

U.S. PATENT DOCUMENTS

| | | | |
|---|---|---|---|
| 4,096,026 | 6/1978 | Takeuchi | 156/656 |
| 4,105,468 | 8/1978 | Geshner | 156/656 |
| 4,166,148 | 8/1979 | Sakurai | 156/656 |
| 4,178,403 | 12/1979 | Sakurai et al. | 428/209 |

FOREIGN PATENT DOCUMENTS 53-114356 10/1978 Japan .................. 430/5

Primary Examiner—Bruce H. Hess
Attorney, Agent, or Firm—Stevens, Davis, Miller & Mosher

[57] ABSTRACT

In a low reflection type photomask (hard mask) having a chromium masking film provided, through or without an intermediary low reflection layer, on a transparent substrate and further having a low reflection layer provided on the chromium layer, use is made of a composite layer containing chromium oxide and chromium nitride as the low reflection layer. The composite layer is substantially equal in etching speed to the chromium film, and the photomask obtained is free from image deterioration caused by protrusions such as visors, burrs, or fractures, as observed in the photomasks of the prior art using chromium oxide films, and also has excellent durability.

10 Claims, 7 Drawing Figures

FIG. 1a (PRIOR ART)
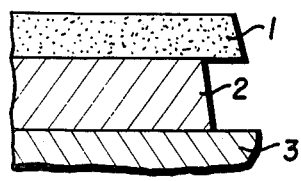
FIG. 1b (PRIOR ART)
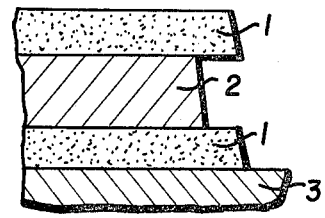
FIG. 2
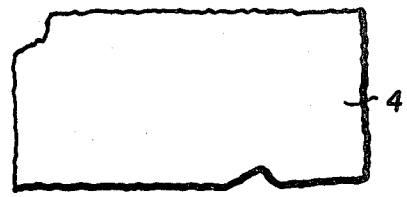
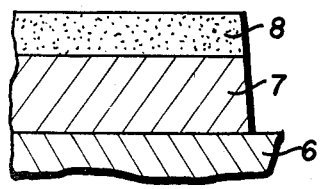
FIG. 3a
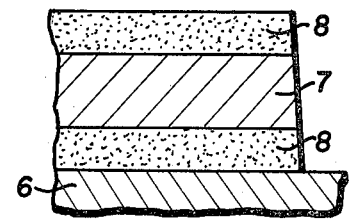
FIG. 3b
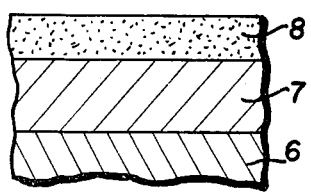
FIG. 4a
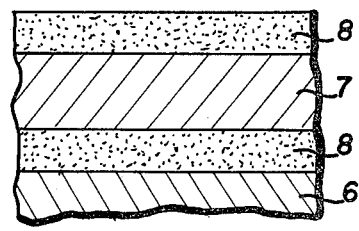
FIG. 4b

PHOTOMASK AND PHOTOMASK BLANK

BACKGROUND OF THE INVENTION

This invention relates to photomasks and photomask blanks for use in the production of semiconductors, integrated circuits (IC), large-scale integrated circuits (LSI), and like electronic components.

Photomasks are original plates for printing very minute circuit images or others repeatedly with good precision on wafers of semiconductors, etc. In the prior art, there have been known emulsion masks using inexpensive photographic plates having high resolving power, and also hard masks of excellent durability, including chromium masks, one-side low-reflection chromium masks, both-side low-reflection chromium masks, silicon masks and others.

In general, for high precision purposes, hard masks of excellent resolving power have been employed. Among them, mono-layer chromium masks have high surface reflectance and therefore repetitive reflections are liable to be caused between masks and wafers. For the purpose of avoiding such repetitive reflections, use is practically made of one-side low-reflection chromium masks in which there is provided a reflection preventive layer on one side and further of both-side low-reflection chromium masks, for enabling actuation of auto mask aligners, in which a reflection preventive layer is also provided on the opposite side.

While these multi-layer masks have the advantages of affording a broad exposure latitude in pattern printing on wafers and of enabling actuation of an auto aligner such as that of Casper Co.'s type, they have a drawback in that it is difficult to form images of good quality and durability on these masks, themselves, as compared with mono-layer type chromium masks.

More specifically, this problem is due to the difference in etching speed between the chromium layer and the chromium oxide layer laminated on the upper or lower surface of the chromium layer when the masking layer in the multi-layer structure is to be patterned by etching according to the well-known photolithography process. Usually, the etching speed in the chromium oxide layer is slower by several times than in the chromium layer. Therefore, since the etching speed is faster in the lower chromium layer than in the upper chromium oxide layer, the undercut quantity of the chromium layer is greater, thereby forming a visor of the chromium oxide layer at peripheral portions of images.

On the other hand, because the etching speed varies greatly at an intermediary portion of the entire film, the film as a whole is prone to be unevenly etched, whereby the sharpness of image is impaired, and formation of edges like burrs or mouse nip is frequently caused. Formation of visors around patterns is a great problem because such visors protrude out of the pattern edges as films of some hundred angstroms in thickness, which are very brittle and readily fractured. Practically, fracture will occur in various washing procedures during fabrication or usage of masks or in contact with or peel-off from the resist surface during transfer of images, thereby causing edges like discontinuous burrs or mouse nip to be formed around the images.

The above phenomenon is in contradiction to use for an acceptable high precision transfer and is particularly incompatible with the purpose of producing high performance semiconductor devices such as V-LSI. On the other hand, formation of visors around mask patterns also means that the optical concentration gradient of the image edges is microscopically gentle, whereby dimensional accuracy at the time of transfer is readily affected by exposure conditions to cause lowering of precision.

As a method generally practiced for overcoming these problems, chromium films and chromium oxide films are formed according to the methods which are different from each other. For example, a chromium film of the lower layer is formed by sputtering, while a chromium oxide film of the upper layer is deposited by vacuum evaporation. This is based on the principle that the chromium oxide layer obtained by vacuum evaporation can be etched faster than that formed by sputtering, its etching speed being nearer to the etching speed of the chromium film formed by sputtering. The reason why there is such a difference in etching speed between the methods has not yet been clarified, but it is presumably because sputtering can produce films which are generally more dense as compared with those formed by vacuum evaporation, which are sparse and lower in degree of oxidation.

If, instead of resorting to this method, the chromium and chromium oxide layers are laminated by only the ordinary sputtering method or vacuum evaporation method, visors or burrs will be formed since the etching speed of the chromium oxide layer is relatively higher than that of the chromium layer as stated above. A critical drawback resulting from a combination of the sputtering method and the vacuum evaporation method is a remarkably low productivity due to the steps of first forming a film by sputtering, thereafter taking the product once out of the vacuum, and again performing vapor deposition of a film in a vacuum evaporator. Further, with respect to quality, also, a chromium oxide film is formed again on the chromium film which has been once exposed to the atmosphere, whereby the chromium oxide film obtained has poor reproducibility of the film properties. Another disadvantage is that there is a great probability of dust being drawn in to adhere on the chromium film when returning from vacuum to atmospheric pressure in the apparatus after formation of the chromium film of the lower layer, whereby pinholes are liable to be formed in the chromium oxide film of the upper layer. If an intermediate washing step is introduced for avoiding this probability, the number of steps will be increased, and the quality of the product may be unstable, varying with such washing operations.

Of course, it is possible to vary to some extent the etching speed of a film by changing the conditions for the fabrication of the film according to each of the sputtering and vacuum evaporation methods thereby to change to some extent the density or degree of oxidation of the film, but the range of such a variation is very narrow, and a drastic change in conditions may result in impairment of the basic properties of photomasks such as film strength, chemical resistance, and othrs, or in marked lowering of productivity. For example, when a chromium oxide film is formed by sputtering, it is possible to form a chromium oxide film with lower degree of oxidation by controlling the partial pressure in the atmosphere, the film having an etching speed similar to that of a chromium film. However, it is extremely difficult to control the sputtering conditions for formation of this film in an intermediary oxidized state, and the reproducibility is poor. Further, if the degree of oxidation is too low, the refractory index of the film is increased to impair the effect of prevention of reflection as originally intended. The difficulty in controlling the formation of the above intermediarily oxidized film is further pronounced in the case of reactive vapor deposition.

SUMMARY OF THE INVENTION

In order to overcome the problems involved in the prior art as described above, I have investigated various materials in place of chromium oxide films as reflection preventive layers which will not impair the chromium mask characteristics of the prior art. As a result, it has now been found that a composite chromium nitride-chromium oxide film can be provided as reflection preventive layer on a chromium film to solve the above problems and produce a mask with markedly excellent characteristics with high productivity. The present invention is based on this finding.

The present invention is based in principle on the higher etching speed of a chromium nitride film, contrary to that of a chromium oxide film, relative to a chromium film. By suitable variation of the ratios in the composition of chromium oxide and chromium nitride, it becomes possible to control the etching speed over a considerably wide range.

The composite film of chromium oxide and chromium nitride has chemical resistance and optical characteristics which are substantially the same as a conventionally used chromium oxide film, yet being free of the problems as described above, and is capable of realizing images with excellent durability and high precision.

Thus, a characteristic feature of the photomask blank according to the present invention resides in a structure comprising a chromium film as a masking layer and a composite film of chromium oxide and chromium nitride as a reflection preventive layer laminated on the chromium film.

The photomask according to the present invention is characterized in that the above laminated film which has been patternized is provided on a transparent substrate.

The nature, utility, and further features of this invention will be more clearly apparent from the following detailed description, beginning with a consideration of general aspects of the invention and concluding with specific examples of practice thereof, when read in conjunction with the accompanying drawing, briefly described below.

BRIEF DESCRIPTION OF THE DRAWINGS

In the drawing:

FIGS. 1a and 1b are schematic sectional views, with parts cut away, respectively showing examples of multilayer photomasks of the prior art;

FIG. 2 is a plan view of a multi-layer photomask of the prior art indicating shapes of edges of an image;

FIGS. 3a and 3b are sectional views, similar to FIGS. 1a and 1b, respectively showing examples of multi-layer photomask according to this invention; and FIGS. 4a and 4b are schematic sectional views, with parts cut away, respectively showing examples of multilayer photomask blanks according to the invention.

DETAILED DESCRIPTION OF THE INVENTION

According to the one-side low-reflection chromium mask and both-side low-reflection chromium mask of the prior art, as shown in FIGS. 1a and 1b, respectively, a chromium layer 2 and an upper chromium oxide layer 1 are formed without an intermediary lower chromium oxide layer [as in FIG. 1a] or through an intermediary lower chromium oxide layer [as in FIG. 1b] on a transparent substrate 3. The primary problem in low-reflection chromium masks of the prior art was that the undercut quantity of the chromium layer 2 is increased because of higher etching speed in the chromium layer 2 than in the upper chromium oxide layer 1 to form a projection like a visor of the chromium oxide layer 1, which may result in fractures such as burrs or mouse nip on the first image 4 as shown in FIG. 2.

FIG. 3a is a schematic view of the sectional structure of one embodiment of the one-side low-reflection chromium mask according to the present invention. On a transparent substrate 6, which is made of soda lime glass, borosilicate glass, quartz glass, sapphire, or the like having surface smoothness, there is provided a chromium film as a masking layer 7, of a thickness of generally 300 to 1500 Å, preferably 500 to 1000 Å, by a conventional method such as vacuum evaporation or sputtering, on which chromium film is further provided, as a reflection preventive film 8, a composite film of chromium oxide and chromium nitride, generally of a thickness of 200 to 400 Å. Thereafter patternization of the laminated films is carried out.

FIG. 3b shows a schematic drawing of one embodiment of a both-side low-reflection chromium mask according to the present invention. On a transparent substrate 6 similar to that described above, there is provided a composite film 8 of chromium oxide and chromium nitride, of a thickness of generally 200 to 500 Å, preferably 300 to 400 Å, and then a chromium film 7 with thickness of 300 to 1500 Å, preferably 400 to 1000 Å, is formed on the composite film. Further, a composite film 8 of chromium oxide and chromium nitride similar to that described above is formed on said chromium film. Thereafter, patternization of the laminated films is carried out.

The composition in the composite film, which may be different depending on the conditions for preparation of the film, is suitably within the range of $x=1$, $y=0.1-0.3$ and $z=0.8-1.4$ (atomic ratio) when the composition of the film is represented by the formula $Cr_xN_yO_z$. Practically, it is necessary to select optimum values for x, y and z so that the etching speed in each film will coincide with each other in conformity with the device and conditions for formation of the film. This composite film can be prepared by a sputtering method wherein there is used a target with a composition of $Cr_xN_yO_z$ prepared by mixing chromium oxide and chromium nitride in the form of powder in a suitable ratio and then by sintering; a reactive sputtering method wherein sputtering is performed in an atmosphere of a gas mixture of $N_2$ and $O_2$, with use of chromium as target; a vacuum evaporation method wherein $Cr_xN_yO_z$ is used as a source; or a reactive vapor deposition method wherein chromium is used as source in an atmosphere of a gas mixture of $N_2$ and $O_2$. The existing state of chromium oxide and chromium nitride in the thus prepared composite film, while it has not yet been clarified in detail, seems to be a compound of higher order rather than a simple mixture or in a mixed state of a mixture with a compound of higher order. It is also possible to incorporate such a small amount of other elements in the composite film, that they will not influence substantially the etching speed thereof.

In forming successively the chromium film 7 and the composite film 8 on the transparent substrate 6, the source composition can be changed in a sputtering method or a vacuum evaporation method, while the atmosphere can be changed from vacuum or an inert gas to a $N_2$-$O_2$ gas mixture in a reactive sputtering method or a reactive vacuum evaporation method, thereby to enable preparation of multi-layer mask blanks according to the same method without taking out the product once into the atmosphere.

The thus prepared photomask blank according to the present invention has a layer structure as shown in FIG. 4a or 4b corresponding to FIG. 3a or 3b.

In order to prepare a photomask as shown in FIG. 3a or 3b from such a photomask blank, a conventional photolithography process or electron beam lithography for patternization of the chromium film 7 and the composite film 8 may be used. Thus, a photoresist or an electron beam resist is applied as coating on the composite film of the photomask blank as shown in FIG. 4, then a pattern exposure is effected by ultraviolet rays or an electron beam. This step is then followed by development with a suitable developing agent, and then the exposed composite film 8 and the chromium film 7 are subjected to etching. As an etchant, a mixed aqueous solution of perchloric acid and ammonium ceric nitrate and other etching solutions in general for chromium etching may be used. Gaseous etchants such as a gas mixture of $CCl_4+O_2$ or $Cl_2+Ar+O_2$ may also be used for a dry etching method, especially a plasma etching method, to obtain a similar result.

The photomask according to the present invention thus prepared is free from a visor, burr or fracture as described above in the low reflective layer (composite film 8), since the etching speed in the composite film is made equal to that in the chromium film by adjustment of the ratio x, y and z in the composite film, and therefore it is a sharp and highly precise mask with excellent durability. Further, the resultant mask can be subjected to ultrasonic washing, scrubber washing with a rotating brush or washing with high pressure water without any change in image quality. Transfer of image onto wafers can also be repeated without damaging the edges of the image.

In order to indicate more fully the nature and utility of this invention, the following examples are set forth, it being understood that these examples are presented as illustrative only and are not intended to limit the scope of the invention.

EXAMPLE 1

On a soda lime glass substrate, whose surface had been polished to ample smoothness, a chromium layer was first formed to a thickness of 500 Å by sputtering in an inert atmosphere of argon with the use of a chromium target, and then a composite film of chromium oxide and chromium nitride was laminated thereon to a thickness of 300 Å by sputtering with the use of the same argon gas and a composite of chromium oxide and chromium nitride as target, to prepare a one-side low-reflection chromium mask blank.

The first layer chromium film was formed under the conditions of a gas pressure of $1\times10^{-2}$ Torr, a substrate-target distance of 5 cm, and a sputtering speed of 100 Å/min.

The second layer composite film was formed under the conditions of a gas pressure similarly of $1\times10^{-2}$ Torr, a substrate-target distance of 5 cm, a target composition in $Cr_xN_yO_z$ of x:y:z=1:0.3:1.3, and a sputtering speed of 40 Å/min.

The mask blank obtained was made into a photomask according to the well known photolithography process, whereupon there was obtained a very sharp image with minimum line width of 1.0 μm. The photoresist employed in the photolithography process was AZ-1350 (produced by Shipley Co.) with a thickness of 0.5 μm.

The etchant used for etching the chromium film and the composite film had the following composition:

| | |
|---|---|
| $(NH_4)_2Ce(NO_3)_6$: ammonium ceric nitrate | 165 g |
| $HClO_4$: percholoric acid | 43 cc |
| $H_2O$: deionized water | 1000 cc |

The etching was conducted at 20° C. for 40 seconds.

When the thus prepared photomask was subjected to high pressure water washing by means of a plate cleaner (produced by Ultratech Co.), no change in image quality was observed. The water pressure was 2,000 psi, and washing was continued for 2 minutes.

EXAMPLE 2

On a quartz glass plate having a well polished surface, a composite film of chromium oxide and chromium nitride was first formed to a thickness of 400 Å by the inert sputtering method with argon gas and a composite of chromium oxide and chromium nitride as target. Then, according to the inert sputtering method, with an argon gas and chromium target, a chromium film was laminated on the composite film to a thickness of 500 Å. This step was followed further by lamination of another composite film of chromium oxide and chromium nitride according to the same method as that used in the first layer to a thickness of 300 Å, thus providing a both-side low-reflection chromium mask blank.

The composite films for the first and the third layers were formed under the conditions of an argon gas pressure of $2\times10^{-2}$ Torr, a substrate-target distance of 5 cm, a sputtering speed of 70 Å/min., and a target composition for $Cr_xN_yO_z$ of x:y:z=1:0.2:1.2.

The chromium film for the second layer was formed under the conditions of an argon gas pressure of $8\times10^{-3}$ Torr, a substrate-target distance of 5 cm, and a sputtering speed of 120 Å/min.

The mask blank thus prepared had a front surface reflectance of 5% for Hg-g line and a backside reflectance of 10% for Hg-e line.

Then, according to the same method as in Example 1, a photomask having a very sharp image with minimum line width of 0.8 μm was prepared. When ultra-sonic washing at 300 W was applied on this photomask for 10 minutes, and, further, high pressure water washing was applied thereto similarly as in Example 1, nothing abnormal in the image quality was observable, and a precise image could be repeatedly transferred onto wafers.

As is apparent from the foregoing description, a photomask and a photomask blank therefor which can produce images with high precision and have longer durability than those of the prior art can be obtained according to the present invention.

What is claimed is:

1. A photomask blank comprising a transparent substrate and a multi-layer masking film provided on the substrate, said multi-layer masking film comprising a layer of chromium and a composite layer of chromium oxide and chromium nitride laminated on said chromium layer.

2. A photomask blank according to claim 1, wherein another composite layer of chromium oxide and chromium nitride is interposed between the chromium layer and the transparent substrate.

3. A photomask blank according to claim 1, wherein the atomic ratio of Cr:N:O in the composite layer is in the range of 1:0.1–0.3:0.8–1.4.

4. A photomask blank according to claim 1, wherein the composite layer is formed by sputtering or vacuum evaporation using as source a sintered product of mixed powders of chromium oxide and chromium nitride.

5. A photomask blank according to claim 1, wherein the composite layer is formed by reactive vacuum evaporation or reactive sputtering using chromium as source in an atmosphere of mixed $N_2$-$O_2$ gas.

6. A photomask blank according to claim 1, wherein the composite layer has a thickness in the range of from 200 to 500 Å.

7. A photomask comprising a transparent substrate and a patternized multi-layer masking film provided on the substrate, said multi-layer masking film comprising a layer of chromium and a composite layer of chromium oxide and chromium nitride laminated on said chromium layer.

8. A photomask according to claim 7, wherein another composite layer of chromium oxide and chromium nitride is interposed between the chromium layer and the transparent substrate.

9. A photomask according to claim 7, wherein the atomic ratio of Cr:N:O in the composite layer is in the range of 1:0.1–0.3:0.8–1.4.

10. A photomask according to claim 7, wherein the multi-layer masking film has been patternized by etching.

* * * * *